United States Patent [19]

Fabrizio et al.

[11] Patent Number: 4,536,265
[45] Date of Patent: Aug. 20, 1985

[54] SILOXANE POLYPHOTOINITIATORS OF THE SUBSTITUTED ACETOPHENONE TYPE

[75] Inventors: Louis F. Fabrizio, Hartford, Conn.; Samuel O. S. Lin, Edgewater, N.J.; Anthony F. Jacobine, Meriden, Conn.

[73] Assignee: Loctite Corporation, Newington, Conn.

[21] Appl. No.: 601,881

[22] Filed: Apr. 19, 1984

[51] Int. Cl.³ .............................................. C08F 2/46
[52] U.S. Cl. .............................. 204/159.13; 556/436; 528/25; 528/26
[58] Field of Search .................... 556/436; 528/25, 26; 204/159.13

[56] References Cited

U.S. PATENT DOCUMENTS

| | | | |
|---|---|---|---|
| 4,273,907 | 6/1981 | Takamizawa et al. | 556/436 |
| 4,337,348 | 6/1982 | Takamizawa et al. | 556/436 |
| 4,391,963 | 7/1983 | Shirahata | 528/37 |
| 4,477,326 | 10/1984 | Lin | 204/159.13 |

Primary Examiner—Melvyn I. Marquis
Attorney, Agent, or Firm—Walter J. Steinkraus; Eugene F. Miller

[57] ABSTRACT

An organopolysiloxane photoinitiator having an average of at least two siloxane units, of which at least an average of one siloxane unit per organopolysiloxane molecule has the formula:

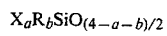

wherein a is an integer of 1-3, b is a integer of 0-2 and a plus b equals 1-3; R is $C_1$-$C_{10}$ hydrocarbyl or halogen substituted $C_1$-$C_{10}$ hydrocarbyl; and X is substituted acetophenone photomoiety of the formula:

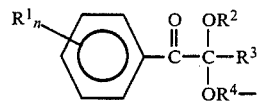

where $R^1$ is any substitutent which will not interfere with hydrosilation, n is an integer between 0 and 4; $R^2$ is organosilyl substituted alkyl or alkenyl; $R^3$ is H, alkyl or aryl; and $R^4$ is a divalent hydrocarbon group having between 2 and 10 carbon atoms.

The silicones are prepared by hydrosilation of the corresponding olefinically or acetylenically α,α-dialkenylacetophenones or α,α-dialkynylacetophenones.

8 Claims, No Drawings

SILOXANE POLYPHOTOINITIATORS OF THE SUBSTITUTED ACETOPHENONE TYPE

BACKGROUND OF THE INVENTION

This application is related to an application filed concurrently herewith by S. Lin and A. Jacobine under the same title.

Many photoinitiators have been developed which are soluble in, and effectively cure, unsaturated organic resins. However, it has been found that such photoinitiators often have limited solubility, and therefore reduced curing effectiveness, in silicones. To overcome this compatibility problem, it has been proposed chemically bond certain photoinitiating moieties to silicones.

A Japanese patent publication, Kokai No. 34,291/76 describes the use of benzophenone derivatives, such as 4-dimethylamino-4'-(trimethoxysilyl)benzophenone, in preparing the silicone compatible photoinitiators Another Japanese patent publication, Kokai No. 71,199/78, describes the preparation of photoinitiators from the reaction of alkenylsilylbenzophenone and silicones containing silicon hydrides.

Japanese patent publication Kokai No. 50,067/79 and U.S. Pat. No. 4,273,907, describe benzoin type photoinitiators attached to the ends of polydimethylsiloxane through an Si—O—C bond. However, the Si—O—C bond is well known to be hydrolytically unstable.

In U.S. Pat. No. 4,391,963 and in co-pending application Ser. No. 505,588, filed June 20, 1983, now U.S. Pat. No. 4,447,326, there are described silicones having benzoin photomoieties bonded thereto through Si—C bonds. These materials are prepared by hydrosilation of alkenyl substituted benzoins.

In co-pending application Ser. No. 528,287, filed Aug. 31, 1983, there are described Si—H functional siloxy compounds having various alkyl-aryl ketone photoinitiating moieties bound to silicon. These compounds are also prepared by hydrosilation of appropriate olefinically or acetylenically unsaturated photomoieties.

In EPO publication No. 0,088,842 there are described silicon bonded benzophenone polyphotoinitiators prepared by hydrosilation of an alkenyloxy-substituted benzophenone.

SUMMARY OF THE INVENTION

The present invention relates to novel photoinitiating silicones in which a photomoiety of the substituted acetophenone type is bound to a silicon atom by a Si—C bond. The new photosensitive silicones are conveniently prepared by two step hydrosilation of corresponding $\alpha,\alpha$-dialkenylacetophenones or $\alpha,\alpha$-dialkynylacetophenones.

Compositions of the inventive photoinitiators and free radical curable resins such as silicones with free radical curable functional groups may be photo cured actinic radiation. Examples of suitable free radical curable functional groups are vinyl and acrylic groups.

DETAILED DESCRIPTION OF THE INVENTION

The inventive polyphotoinitiators are organopolysiloxanes having an average of at least two siloxane units, of which at least an average of one siloxane unit per organopolysiloxane molecule has the formula:

$$X_aR_bSiO_{(4-a-b)/2}$$

wherein a is an integer of 1–3, b is an integer of 0–2 and a plus b equals 1–3; R is $C_1$–$C_{10}$ hydrocarbyl or halogen substituted $C_1$–$C_{10}$ hydrocarbyl; and X is a substituted acetophenone photomoiety of the formula:

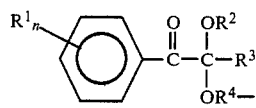

where $R^1$ is any substituent which will not interfere with hydrosilation, n is an integer between 0 and 4; $R^2$ is organosilyl substituted alkyl; $R^3$ is H, alkyl or aryl; and $R^4$ is a divalent hydrocarbon group having between 2 and 10 carbon atoms.

Suitable R groups in the above formula include alkyls such as methyl and ethyl, halogen substituted alkyls such as trifluoropropyl and aryls such as phenyl.

Suitable $R^1$ substituents include halo, alkyl, and alkoxy.

The $R^2$ groups may be linear, branched or cyclic organosilyl substituted alkyls, such as $(CH_3)_3Si$-$OSi(CH_3)_2C_3H_6$ and trimethylsilylpropyl.

The hydrosilation techniques useful for producing the inventive polyphotoinitiators are analogous to those described in the aforementioned U.S. Pat. No. 4,391,963 and co-pending application Ser. Nos. 505,588 and 528,287, the disclosures of which are incorporated herein by reference. As described in those references, SiH functional silicones may be used to directly hydrosilate the unsaturated photomoiety. Alternatively, SiH functional silanes having polymerizable functionality such as chloro or alkoxy, may be used followed by condensation of the resulting photoinitiating silane with other silanes or silicones.

Unsaturated acetophenones suitable as intermediates in the production of inventive polyphotoinitiators can be synthesized by transacetalization of an $\alpha,\alpha$-dialkoxyacetophenone with an unsaturated alcohol, followed by blocking of one of the unsaturated groups as exemplified in the Examples. The blocking step is conviently performed with a non-hydrolyzable silane or low molecular weight organosiloxane compound as the first step hydrosilation procedure. The second, conducted in the same reaction, is the previously discussed hydrosilation to a hydrolyzable silane or silicone polymer.

Other synthetic methods for obtaining the unsaturated intermediate photomoieties may occur to those skilled in the art without departing from the invention hereof which is illustrated by the following nonlimiting examples.

EXAMPLE 1

Diallyoxyacetophenone was prepared as follows. Diethoxyacetophenone (104 grams) and 300 ml allyl alcohol were stirred and heated with 8 grams p-toluene sulfonic acid $H_2O$. As ethyl alcohol was removed via a Dean-Stark trap another 109 mls allyl alcohol was added. The reaction was monitored by glpc until completion. The mixture was then cooled and 500 mls of saturated sodium bicarbonate solution was added. The organic fraction was separated and the aqueous fraction extracted with hexane. The organic fractions were then combined, dried, filtered and concentrated. The product was purified by distillation at 125°–130° C./0.9 mm Hg.

EXAMPLE 2

Into a 25 ml 3 neck round bottomed flask equipped with a thermometer and stirrer replaced 1 gram of diallyloxyacetophenone and 0.63 grams of pentamethyldisiloxane. The flask was placed in an oil bath at 85° C. When the temperature reached 85° C., 0.5 grams of a 2% chloroplatinic acid solution were added. After stirring for 5 minutes, 2.2 grams of an approximately 1,000 molecular weight dimethylsilicone terminated with silicon hydride (0.002 eq.H/gram) were added along with an additional 0.05 grams of chloroplatinic acid solution. An exotherm from 110° C. to 125° C. was observed. After about 5 minutes the reaction was allowed to cool producing a dark fluid product. This product was soluble in a 70,000 molecular weight silicone containing 8% by mole methylvinylsiloxane units.

A 20% solution of the product in this vinyl silicone cured a ¼ inch slug when exposed to UV irradiation of 70,000 microwatts per square centimeter for 2 minutes.

The soluability of this low molecular weight silicone photoinitiator in high molecular weight silicones was particularly surprising since a benzoin type photoinitiator prepared from the same 1,000 molecular weight silicone by the method of U.S. Pat. No. 4,391,963 was not soluble in other higher molecular weight silicones.

Acetylenic alcohols, such as propargyl alcohol may be substituted for allyl alcohol in example 1. Likewise, other organosilicon hydride compounds, such as trimethylsilane may be substituted for the pentamethyldisiloxane used in example 2. Preferably, however, such silicon compounds, if siloxanes, will contain no more than about 5 siloxane units.

We claim:

1. An organopolysiloxane photoinitiator having an average of at least two siloxane units, of which at least an average of one siloxane units per organopolysiloxane molecule has the formula:

$$X_a R_b SiO_{(4-a-b)/2}$$

wherein a is an integer of 1–3, b is an integer of 0–2 and a plus b equals 1–3; R is $C_1$–$C_{10}$ hydrocarbyl or halogen substituted $C_1$–$C_{10}$ hydrocarbyl; and X is substituted acetophenone photomoiety of the formula:

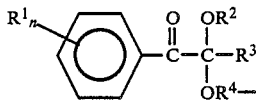

where $R^1$ is any substituent which will not interfere with hydrosilation, n is an integer between 0 and 4; $R^2$ is organosilyl substituted alkyl or alkenyl; $R^3$ is H, alkyl or aryl; and $R^4$ is a divalent hydrocarbon group having between 2 and 10 carbon atoms.

2. A photoinitiator as in claim 1 where R is alkyl, substituted alkyl or aryl.

3. A photoinitiator as in claim 1 where $R^1$ is halo, alkyl or alkoxy.

4. The photoinitiator of claim 1 where n is 0.

5. The photoinitiator of claim 1 where $R^4$ is propylene or propenylene.

6. The photoinitiator of claim 1 where $R^2$ is $(CH_3)_3SiOSi(CH_3)_2C_3H_6$ or trimethylsilylpropyl.

7. The method of curing a free radical curable silicone resin having acrylic or vinyl functionality comprising subjecting to actinic radiation a composition of said resin and a photoinitiator as in claim 1.

8. A composition comprising a photoinitiator as in claim 1 and a free radical curable silicone resin with acrylic or vinyl functionality.

* * * * *